United States Patent
Rofougaran et al.

(10) Patent No.: US 8,355,688 B2
(45) Date of Patent: Jan. 15, 2013

(54) METHOD AND SYSTEM FOR FREQUENCY SELECTION USING MICROSTRIP TRANSCEIVERS FOR HIGH-SPEED APPLICATIONS

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 1046 days.

(21) Appl. No.: 12/033,273

(22) Filed: Feb. 19, 2008

(65) Prior Publication Data
US 2009/0206944 A1 Aug. 20, 2009

(51) Int. Cl.
*H04B 1/06* (2006.01)
*H04B 7/00* (2006.01)

(52) U.S. Cl. ........ 455/262; 455/255; 455/256; 455/257; 455/258; 455/259; 455/280; 455/282; 331/34; 331/36 R; 331/36 C

(58) Field of Classification Search .............. 455/78–83, 455/120–125, 193.1–193.3, 280–282, 292–293, 455/192.1–192.3, 255–265; 343/700 MS, 343/820–823, 860–865, 904–905; 333/124–125; 331/34, 36 R, 36 C
See application file for complete search history.

(56) References Cited

U.S. PATENT DOCUMENTS

| | | | |
|---|---|---|---|
| 6,400,336 B1 * | 6/2002 | Gleener | 343/860 |
| 6,697,030 B2 * | 2/2004 | Gleener | 343/860 |
| 6,765,540 B2 * | 7/2004 | Toncich | 343/860 |
| 6,801,097 B2 * | 10/2004 | Wallace | 331/179 |
| 6,862,432 B1 * | 3/2005 | Kim | 455/80 |
| 6,882,233 B2 * | 4/2005 | Oh et al. | 331/117 R |
| 6,891,414 B1 * | 5/2005 | Bunch et al. | 327/156 |
| 7,049,907 B2 * | 5/2006 | Gurvich et al. | 333/156 |
| 7,277,677 B2 * | 10/2007 | Ida et al. | 455/78 |
| 7,482,887 B2 * | 1/2009 | Cyr et al. | 331/108 C |
| 7,564,318 B2 * | 7/2009 | Chen | 331/177 V |
| 2004/0147237 A1 * | 7/2004 | Eckl et al. | 455/150.1 |

* cited by examiner

*Primary Examiner* — Tuan A Tran
(74) *Attorney, Agent, or Firm* — Farjami & Farjami LLP

(57) ABSTRACT

Aspects of a method and system for frequency selection using microstrip transceivers for high-speed applications may include determining an operating frequency for operating one or both of a transmitter and a receiver. A frequency response and/or impedance of one or more transmission lines that may be utilized by the transmitter and/or the receiver may be controlled by adjusting one or more capacitances, communicatively coupled to the transmission lines based on the determined operating frequency. The capacitances may be coupled to the one or more transmission line at arbitrary physical spots, and may comprise capacitors and/or varactors. The capacitors and/or the varactors may be adjusted with a digital signal or an analog signal. The capacitances may comprise a matrix arrangement of capacitors and/or varactors. The one or more transmission lines may comprise a microstrip.

18 Claims, 5 Drawing Sheets

METHOD AND SYSTEM FOR FREQUENCY SELECTION USING MICROSTRIP TRANSCEIVERS FOR HIGH-SPEED APPLICATIONS

CROSS-REFERENCE TO RELATED APPLICATIONS/INCORPORATION BY REFERENCE

Not applicable

FIELD OF THE INVENTION

Certain embodiments of the invention relate to electronic circuits. More specifically, certain embodiments of the invention relate to a method and system for frequency selection using microstrip transceivers for high-speed applications.

BACKGROUND OF THE INVENTION

Transmission lines may be a material or structure that may form an electrical path from one place to another, for directing the transmission of energy, for example, electromagnetic waves. Transmission line effects are linked to the length of the transmission line, with respect to the wavelength of the signals that it may transport. In general, for transmission lines exceeding, for example, 1/10 of the signals wavelength, transmission line effects such as reflections and phase delays may become important. A transmission line may be modeled by a complex impedance model, comprising capacitance and/or inductance. Because of this, a transmission line may act as filtering element and may be utilized in applications requiring capacitive or inductive impedances.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A method and/or system for frequency selection using microstrip transceivers for high-speed applications, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for frequency selection using microstrip transceivers for high-speed applications. Aspects of a method and system for frequency selection using microstrip transceivers for high-speed applications may comprise determining an operating frequency for operating one or both of a transmitter and a receiver. A frequency response and/or impedance of one or more transmission lines that may be utilized by the transmitter and/or the receiver may be controlled by adjusting one or more capacitances communicatively coupled to the transmission lines based on the determined operating frequency. The capacitances may be coupled to the one or more transmission lines at arbitrary physical spots, and may comprise capacitors and/or varactors. The capacitors and/or the varactors may be adjusted with a digital signal or an analog signal. The capacitances may comprise a matrix arrangement of capacitors and/or varactors. The one or more transmission lines may comprise a microstrip. The one or more transmission lines may comprise an impedance matching network and/or a filter coupled to a low-noise amplifier. An oscillation frequency of a voltage-controlled oscillator utilized by the transmitter and/or the receiver may be determined by the one or more transmission lines.

Figure 1:
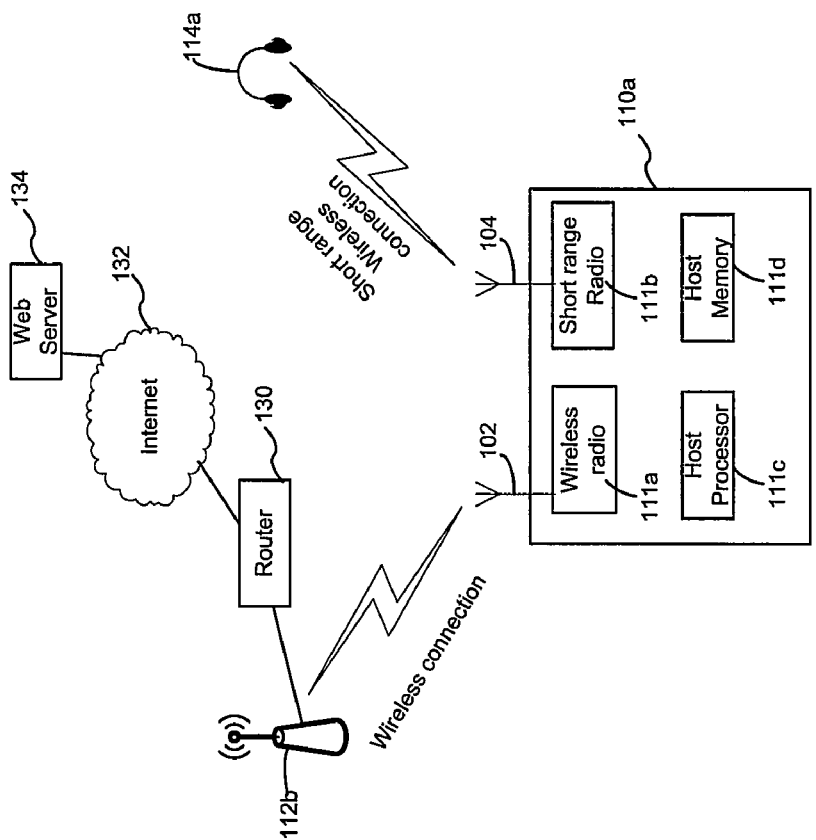
FIG. 1 is a diagram illustrating an exemplary wireless communication system, in accordance with an embodiment of the invention.

FIG. 1 is a diagram illustrating an exemplary wireless communication system, in accordance with an embodiment of the invention. Referring to FIG. 1, there is shown antennas 102 and 104, an access point 112b, a computer 110a, a headset 114a, a router 130, the Internet 132 and a web server 134. The computer or host device 110a may comprise a wireless radio 111a, a short-range radio 111b, a host processor 111c, and a host memory 111d. There is also shown a wireless connection between the wireless radio 111a and the access point 112b, and a short-range wireless connection between the short-range radio 111b and the headset 114a.

Frequently, computing and communication devices may comprise hardware and software to communicate using multiple wireless communication standards. The wireless radio 111a may be compliant with a mobile communications standard, for example. There may be instances when the wireless radio 111a and the short-range radio 111b may be active concurrently. For example, it may be desirable for a user of the computer or host device 110a to access the Internet 132 in order to consume streaming content from the Web server 134. Accordingly, the user may establish a wireless connection between the computer 110a and the access point 112b. Once this connection is established, the streaming content from the Web server 134 may be received via the router 130, the access point 112b, and the wireless connection, and consumed by the computer or host device 110a.

It may be further desirable for the user of the computer 110a to listen to an audio portion of the streaming content on the headset 114a. Accordingly, the user of the computer 110a may establish a short-range wireless connection with the headset 114a. Once the short-range wireless connection is established, and with suitable configurations on the computer enabled, the audio portion of the streaming content may be consumed by the headset 114a. In instances where such advanced communication systems are integrated or located within the host device 110a, the radio frequency (RF) generation may support fast-switching to enable support of multiple communication standards and/or advanced wideband systems like, for example, Ultrawideband (UWB) radio. Other applications of short-range communications may be wireless High-Definition TV (W-HDTV), from a set top box to a video display, for example. W-HDTV may require high data rates that may be achieved with large bandwidth communication technologies, for example UWB and/or 60-GHz communications.

To interconnect various RF components, for example the antenna 102 with the wireless radio 111a, or the antenna 104 with the short range radio 111b, it may be desirable to match the components to maximize energy transfer between the coupled components. This may be achieved, for example, by the use of transmission lines. Transmission lines may, in some instances be implemented as microstrips, for example planar or coplanar microstrips, or strip lines, coaxial cables and others.

In some instances, a host device 110a may be operating in accordance with multiple transmission and/or reception protocols, and/or standards. In these instances, it may be desirable to be able to use adjustable RF components to enable operation over a larger range of operating frequencies to facilitate transmission and/or reception via a plurality of protocols.

Figure 2A:
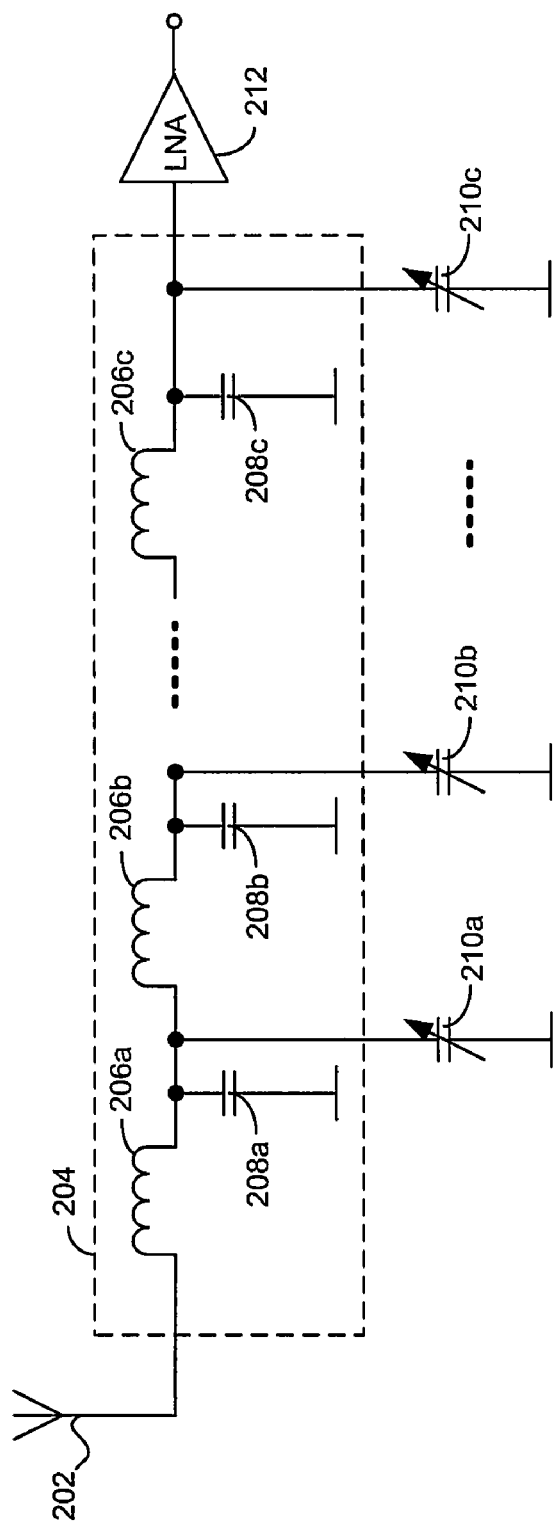
FIG. 2A is a diagram illustrating an exemplary transmission line matching network, in accordance with an embodiment of the invention.

FIG. 2A is a diagram illustrating an exemplary transmission line matching network, in accordance with an embodiment of the invention. Referring to FIG. 2A, there is shown an antenna 202, a transmission line 204, a plurality of capacitors, of which capacitors 210a, 210b, 210c may be shown, and a low-noise amplifier (LNA) 212. The transmission line 204 may comprise suitable logic, circuitry, and/or code that may be enabled to operate similar to an equivalent circuit comprising one or more inductors, of which inductors 206a, 206b, and 206c may be depicted; and one or more capacitors, of which capacitors 208a, 208b, and 208c may be depicted. Hence, the transmission line 204 may comprise suitable logic, circuitry, and/or code that may be enabled to produce a frequency-dependent impedance between a first terminal of the transmission line 204 that may be coupled to the antenna 202, and a second terminal that may be connected to, for example, an LNA 212.

The LNA 212 may comprise suitable logic, circuitry and/or code that may be enabled to generate an output signal that may comprise an amplified version of its input signal. The capacitors 210a, 210b, and 210c, for example, may tap the transmission line 204 at various locations, which may generally be different. In some instances, the capacitors 210a, 210b and/or 210c, for example, may be adjustable. By adjusting and/or selecting appropriate capacitance values for the capacitors 210a, 210b and/or 210c, for example, the impedance characteristics and frequency transfer function characteristics of the transmission line 204 may change. By adjusting the one or more capacitors 210a, 210b, and/or 210c, for example, the transmission line 204 may be adapted to match the output impedance of the antenna 202 to the input impedance of, for example, the LNA 212. Adjusting an impedance of the transmission line 204 may, for example, increase power transfer between the antenna 202 and the LNA 212, and/or reduce reflections. In some instances, more complex filters and/or impedance matching networks may be enabled by using a plurality of transmission lines substantially similar to transmission line 204 in parallel, each of which may be tapped by one or more capacitors. In some embodiments of the invention, the transmission line 204 may be implemented as a microstrip.

In accordance with various embodiments of the invention, the transmission line 204 may be used in an RF transmitter. In this instance, the LNA 212 may be a transmission amplifier and may be coupled to a transmit antenna 202 via a transmission line 204.

Figure 2B:
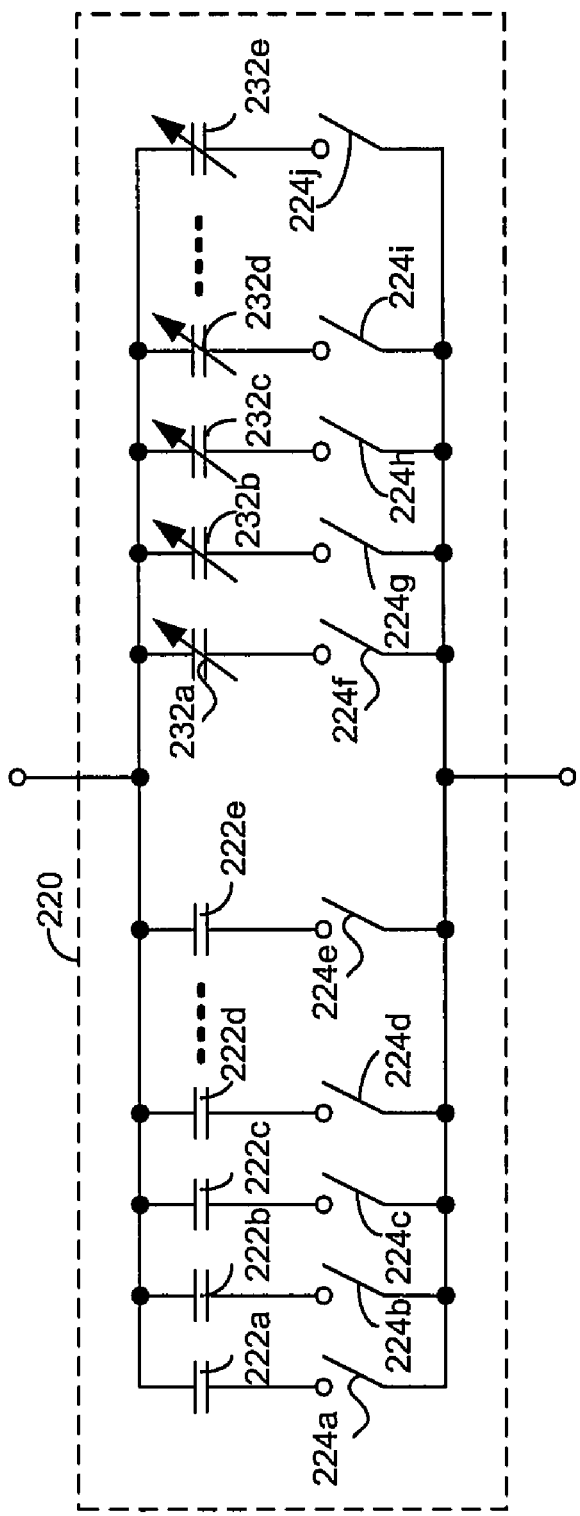
FIG. 2B is a diagram illustrating an exemplary variable capacitance, in accordance with an embodiment of the invention.

FIG. 2B is a diagram illustrating an exemplary variable capacitance, in accordance with an embodiment of the invention. Referring to FIG. 2B, there is shown a variable capacitance 220, comprising one or more capacitors, of which capacitors 222a, 222b, 222c, 222d and 222e may be illustrated, one or more varactors, of which varactors 232a, 232b, 232c, 232d, and 232e may be illustrated, and a plurality of switches, of which switches 224a through 224j may be illustrated.

In accordance with an exemplary embodiment of the invention, the capacitors 222a through 222e may be arranged in parallel with the varactors 232a through 232e. One or more of the capacitors and/or varactors may be disabled by opening one or more of the switches 224a through 224j, for example. By configuring the switches 224a through 224e, a desirable combination of capacitors 222a through 222e may be enabled. In some instances, the switches 224a through 224j may be enabled and/or disabled electronically, and may be controlled digitally. The one or more varactors, for example varactors 232a through 232e may essentially be voltage-controlled capacitances. In some instances, the varactors may be adjusted by an analog signal. In some instances, the varactors may be adjusted by a digital signal. The varactors may comprise suitable logic, circuitry and/or logic that may be enabled to generate an adjustable capacitance between its terminals.

The configuration illustrated in FIG. 2B may be used to generate a large range of capacitance values. For example, a variable capacitance 220 may be used for the capacitors 210a, 210b, and 210c in FIG. 2A. In accordance with various embodiments of the invention, the variable capacitance 220 may be adjusted adaptively, and/or dynamically. In some instances, it may be desirable to arrange the capacitors, for example capacitors 222a through 222e, and the varactors, for example varactors 232a through 232e, in a switchable matrix configuration.

Figure 3:
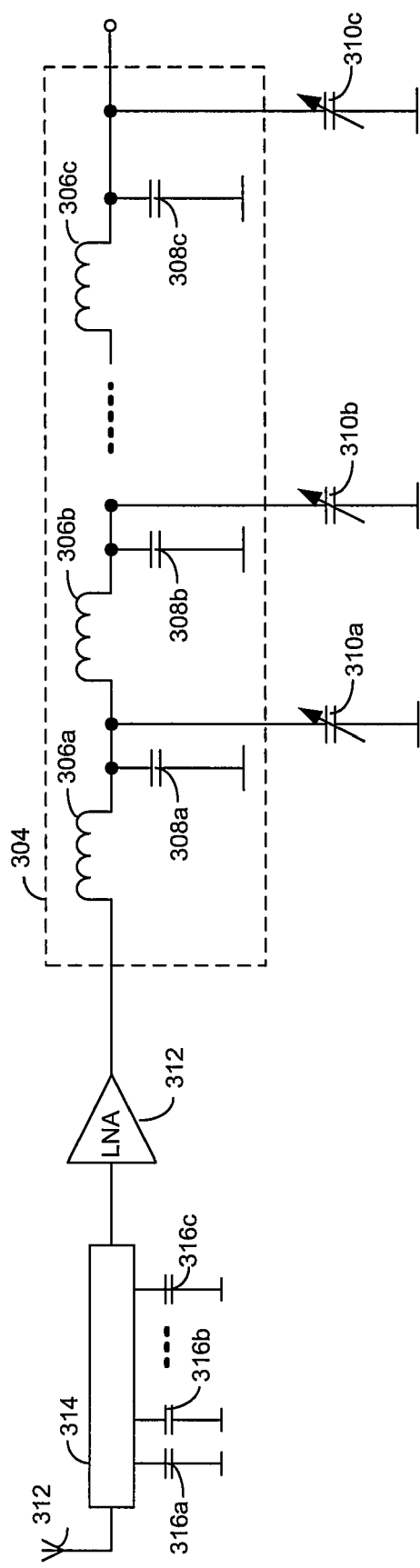
FIG. 3 is a diagram illustrating a combined transmission line filter and impedance matching network, in accordance with an embodiment of the invention.

FIG. 3 is a diagram illustrating a combined transmission line filter and impedance matching network, in accordance with an embodiment of the invention. Referring to FIG. 3, there is shown an antenna 312, a transmission line 304 and 314, a plurality of capacitors, of which capacitors 310a, 310b, 310c, 316a, 316b, and 316c may be illustrated, and an LNA 318. The transmission lines 304 and 314 may be substantially similar to the transmission line 304, and may comprise suitable logic, circuitry, and/or code that may be enabled to operate similar to an equivalent circuit comprising one or more inductors, of which inductors 306a, 306b, and 306c may be depicted; and one or more capacitors, of which capacitors 308a, 308b, and 308c may be depicted. The LNA 318 may be essentially similar to the LNA 212. In accordance with various embodiments of the invention, the transmission lines 314 and 304 may be replaced by multiple transmission lines, coupled in parallel, as described similarly for FIG. 2A.

In accordance with various embodiments of the invention, a transmission line 314 may be coupled between an antenna 312 and an LNA 318, similar to FIG. 2A. In some instances, it may be desirable to add a transmission line 304 at the output of the LNA 318, as depicted in FIG. 3. A configuration with transmission lines before and after the LNA 318 may be desirable to allow a larger range of adjustment capabilities of the transmission line characteristics. For example, the transmission line 304 in combination with the transmission line 314 may be adjusted to improve certain performance parameters with respect to the received signal. For example, in some instances, it may be desirable to achieve maximum gain to improve the received signal power. In another instance, the received signal may be strong and it may be more desirable to operate at a better noise figure than to increase signal gain. In accordance with various embodiments of the invention, the transmission lines 314 and 304 may be dynamically and/or adaptively adjusted to improve certain performance metrics of a receiver system, which may comprise the antenna 312 and the LNA 318.

Figure 4:
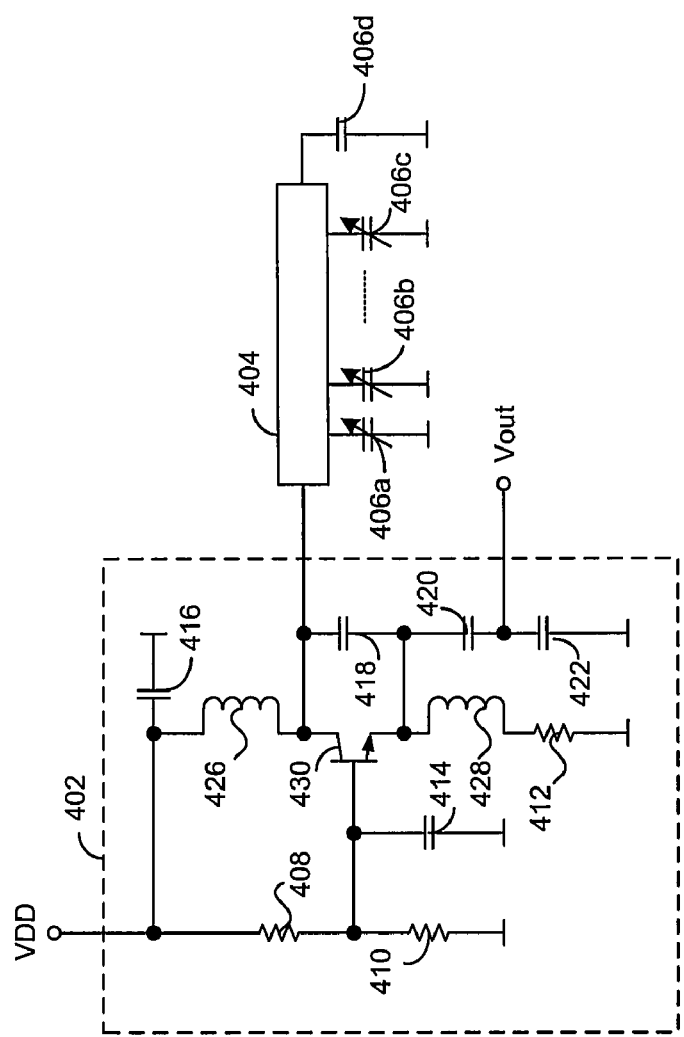
FIG. 4 is a circuit diagram, illustrating a voltage-controlled oscillator (VCO) in accordance with an embodiment of the invention.

FIG. 4 is a circuit diagram, illustrating a voltage-controlled oscillator (VCO) in accordance with an embodiment of the invention. Referring to FIG. 4, there is shown a VCO 402, a transmission line 404, and one or more capacitors, of which capacitors 406a, 406b, 406c, and 406d may be illustrated. In some instances, the capacitors 406a through 406c, for example, may be variable capacitors, for example in accordance with FIG. 2B. The VCO 402 may, for example, comprise resistors 408, 410, and 412, capacitors 414, 416, 418, 420, and 422, inductors 426 and 428, and a transistor 430. The VCO 402 may be a voltage-controlled oscillator based on a Clapp oscillator design, but may not be limited thus. In some instances, the VCO 402 may be implemented as a Colpitts oscillator, or any other suitable oscillator design. There is also shown a supply voltage VDD, and an output voltage Vout.

In accordance with an embodiment of the invention, a first terminal of the resistor 408 may be coupled to VDD, and a second terminal of the resistor 408 may be coupled to a first terminal of the resistor 410. A second terminal of resistor 410 may be coupled to ground. A first terminal of capacitor 416 may be coupled to VDD, and a second terminal may be coupled to ground. A first terminal of inductor 426 may be coupled to VDD, and a second terminal may be coupled to the drain of transistor 430. The drain of transistor 430 may also be coupled to a first terminal of transmission line 404 and a first terminal of capacitor 418. A second terminal of capacitor 418 may be coupled to the source terminal of the transistor 430. The source terminal of the transistor 430 may be coupled to a first terminal of the inductor 428, and a first terminal of capacitor 420. A second terminal of the capacitor 420 may be coupled to a first terminal of capacitor 422. A second terminal of capacitor 422 may be coupled to ground. A second terminal of the inductor 428 may be coupled to a first terminal of the resistor 412, and a second terminal of the resistor 412 may be coupled to ground. The base terminal of the transistor 430 may be coupled to a first terminal of capacitor 414, and to the first terminal of resistor 410. A second terminal of capacitor 414 may be coupled to ground.

In accordance with various embodiments of the invention, the frequency response of the transmission line 404 may determine the frequency of the oscillating signal that may be generated at Vout. The transmission line 404 may be substantially similar to the transmission line 204, for example. Hence, by varying one or more of the capacitors, for example capacitors 406a, 406b, 406c, and or 406d, the frequency response of the transmission line may be changed and the oscillating frequency of the VCO 402 may be adjusted.

In accordance with an embodiment of the invention, a method and system for frequency selection using microstrip transceivers for high-speed applications may comprise determining an operating frequency for operating one or both of a transmitter and a receiver, for example as illustrated in FIG. 1 and FIG. 2A. A frequency response and/or impedance of one or more transmission lines, for example transmission line 204, that may be utilized by the transmitter and/or the receiver may be controlled by adjusting one or more capacitances 210a, 210b, and 210c, communicatively coupled to the transmission lines 204 based on the determined operating frequency. The capacitances may be coupled to the one or more transmission line at arbitrary physical spots, and may comprise capacitors, for example 222a through 222e, and/or varactors, for example 232a through 232e, as illustrated in FIG. 2B. The capacitors and/or the varactors may be adjusted with a digital signal or an analog signal. The capacitances may comprise a matrix arrangement of capacitors and/or varactors, as described for FIG. 2B. The one or more transmission lines may comprise a microstrip. The one or more transmission lines may comprise an impedance matching network and/or a filter coupled to a low-noise amplifier, for example as illustrated in FIG. 3. As illustrated in FIG. 4, an oscillation frequency of a voltage-controlled oscillator utilized by the transmitter and/or the receiver may be determined by the one or more transmission lines.

Another embodiment of the invention may provide a machine-readable storage, having stored thereon, a computer program having at least one code section executable by a machine, thereby causing the machine to perform the steps as described herein for frequency selection using microstrip transceivers for high-speed applications.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
   determining an operating frequency for operating one or both of a transmitter and a receiver; and
   controlling a frequency response and/or impedance of one or more transmission lines utilized by said transmitter and/or said receiver by adjusting one or more capacitances communicatively coupled to said transmission lines based on said determined operating frequency;
   wherein each of said one or more capacitances comprises a plurality of capacitors and varactors connected in parallel and coupled to a switch, and couples said one or more transmission lines to a ground;

wherein said one or more transmission lines determine an oscillation frequency of a voltage-controlled oscillator utilized by said one or both said transmitter and said receiver.

2. The method according to claim 1, wherein said capacitances are coupled to said one or more transmission line at arbitrary physical spots.

3. The method according to claim 1, comprising adjusting said capacitors and/or said varactors with a digital signal.

4. The method according to claim 1, comprising adjusting said capacitors and/or varactors with an analog signal.

5. The method according to claim 1, wherein said capacitors and varactors comprise a matrix arrangement.

6. The method according to claim 1, wherein said one or more transmission lines comprise a microstrip.

7. The method according to claim 1, wherein said one or more transmission lines comprise an impedance matching network coupled to a low-noise amplifier.

8. The method according to claim 1, wherein said one or more transmission lines comprise a filter coupled to a low-noise amplifier.

9. The method according to claim 1, wherein said one or more capacitances tap said transmission lines at different locations.

10. A system for processing communication signals, the system comprising:
one or more circuits, said one or more circuits enable:
determination of an operating frequency for operating one or both of a transmitter and a receiver; and
control of a frequency response and/or impedance of one or more transmission lines utilized by said transmitter and/or said receiver by adjusting one or more capacitances communicatively coupled to said one or more transmission lines based on said determined operating frequency;

wherein each of said one or more capacitances comprises a plurality of capacitors and varactors connected in parallel and coupled to a switch, and couples said one or more transmission lines to a ground;

wherein said one or more transmission lines determine an oscillation frequency of a voltage controlled oscillator utilized by said one or both of said transmitter and said receiver.

11. The system according to claim 10, wherein said one or more capacitances are coupled to said one or more transmission line at arbitrary physical spots.

12. The system according to claim 10, wherein said one or more circuits adjust said capacitors and/or said varactors with a digital signal.

13. The system according to claim 10, wherein said one or more circuits adjust said capacitors and/or varactors with an analog signal.

14. The system according to claim 10, wherein said capacitors and varactors comprise a matrix arrangement.

15. The system according to claim 10, wherein said one or more transmission lines comprise a microstrip.

16. The system according to claim 10, wherein said one or more transmission lines comprise an impedance matching network coupled to a low-noise amplifier.

17. The system according to claim 10, wherein said one or more transmission lines comprise a filter coupled to a low-noise amplifier.

18. The system of claim 10, wherein said one or more capacitances tap said transmission lines at different locations.

* * * * *